United States Patent [19]
Dondale

[11] Patent Number: 5,526,310
[45] Date of Patent: Jun. 11, 1996

[54] MEMORY WITH LATCHED OUTPUT

[75] Inventor: Charles S. Dondale, Fort Collins, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 389,429

[22] Filed: Feb. 14, 1995

Related U.S. Application Data

[63] Continuation of Ser. No. 958,978, Oct. 9, 1992, abandoned.

[51] Int. Cl.$^6$ ........................................ G11C 7/00
[52] U.S. Cl. ........................ 365/196; 365/191; 365/195; 365/207
[58] Field of Search ................. 365/189.05, 230.08, 365/207, 191, 195, 196

[56] References Cited

U.S. PATENT DOCUMENTS

| | | | |
|---|---|---|---|
| 5,043,944 | 8/1991 | Nakamura et al. | 365/189.05 |
| 5,111,386 | 5/1992 | Fujishima et al. | 365/189.05 X |
| 5,119,340 | 6/1992 | Slemmer | 365/230.08 X |
| 5,229,965 | 7/1993 | Inoue | 365/189.05 X |

Primary Examiner—Do Hyun Yoo
Attorney, Agent, or Firm—Wayne P. Bailey; Douglas S. Foote

[57] ABSTRACT

The invention concerns Random-Access Memory (RAM). In many types of RAM currently available, the data on the RAM's output lines can change (or, at least, is no longer guaranteed valid) after the address applied to the RAM changes. The invention maintains the validity of the data after such address changes occur. The data is maintained valid until new data is written to the RAM.

3 Claims, 12 Drawing Sheets

PRIOR ART FIG. 1
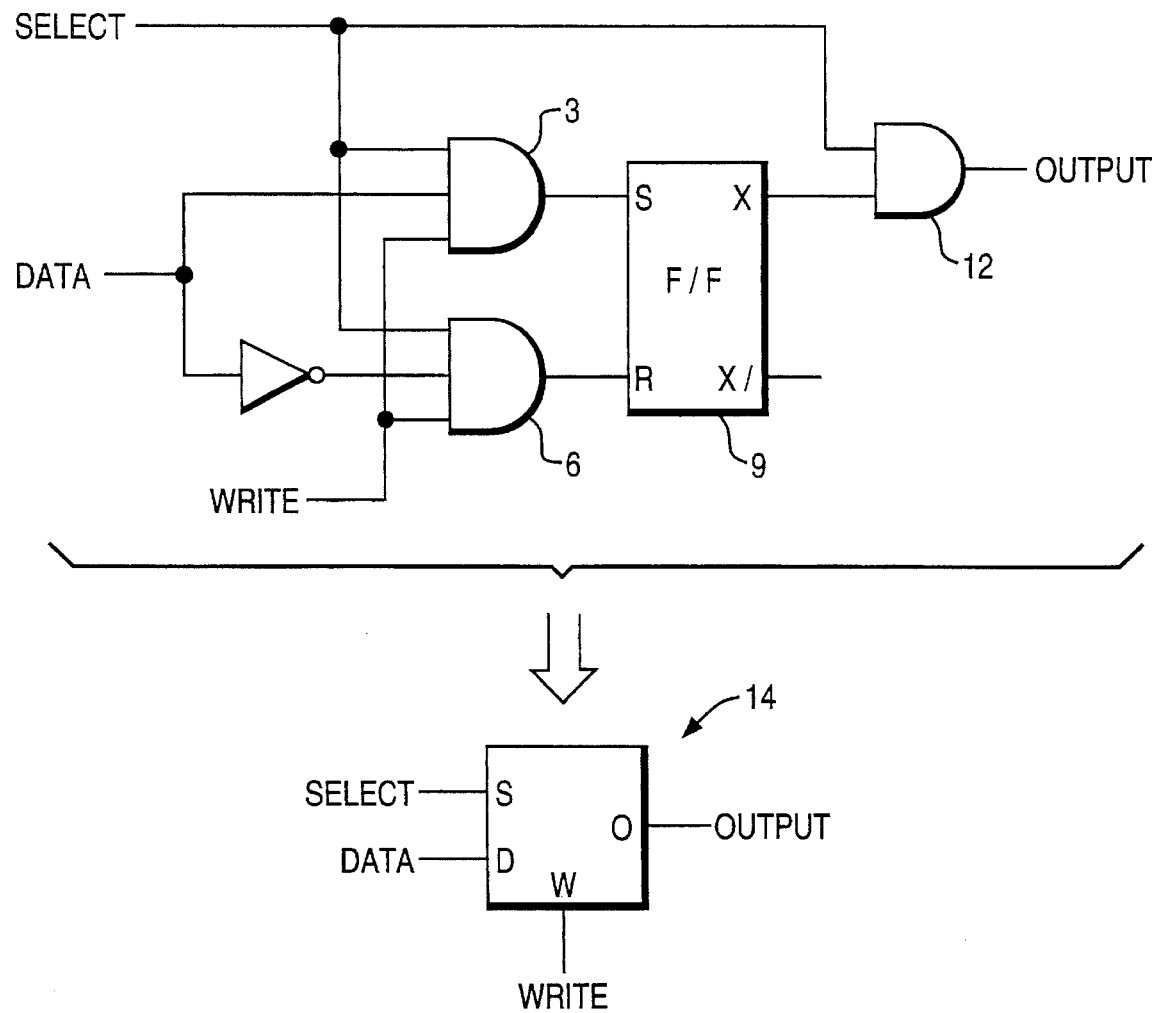
PRIOR ART
FIG. 2
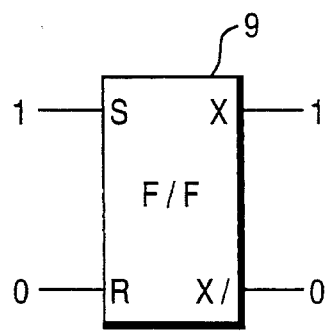
PRIOR ART
FIG. 3
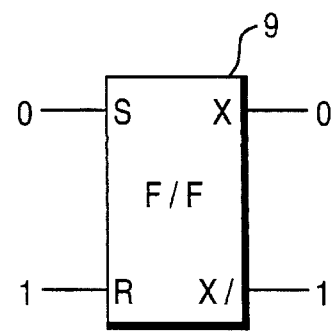

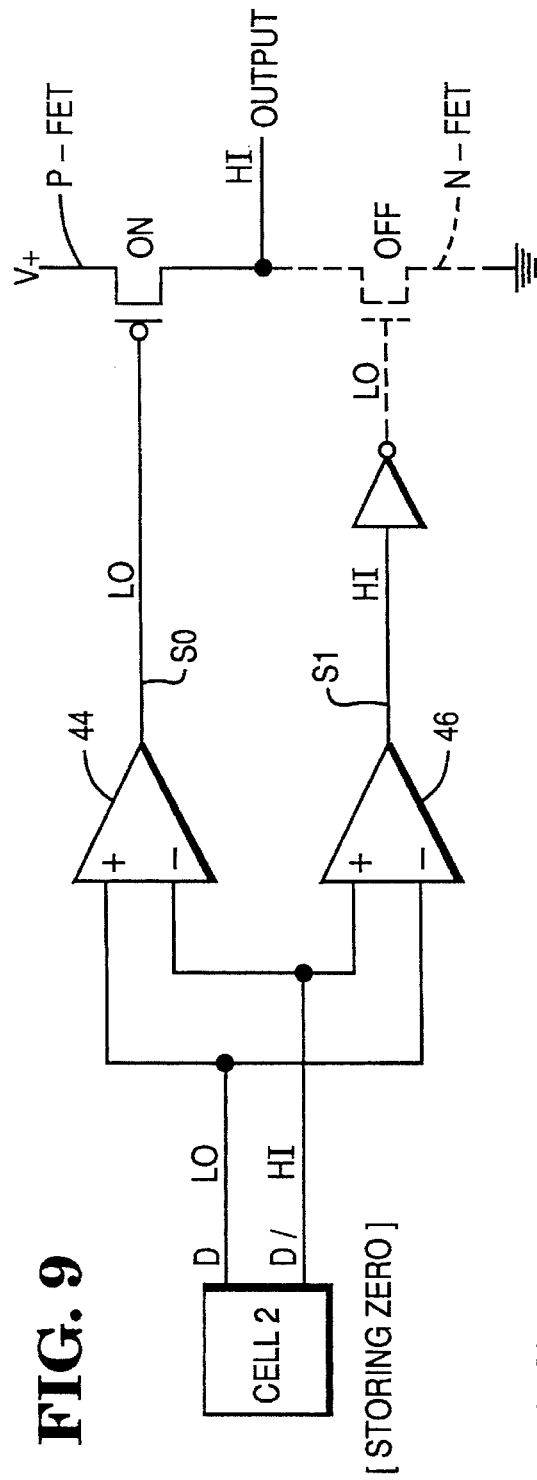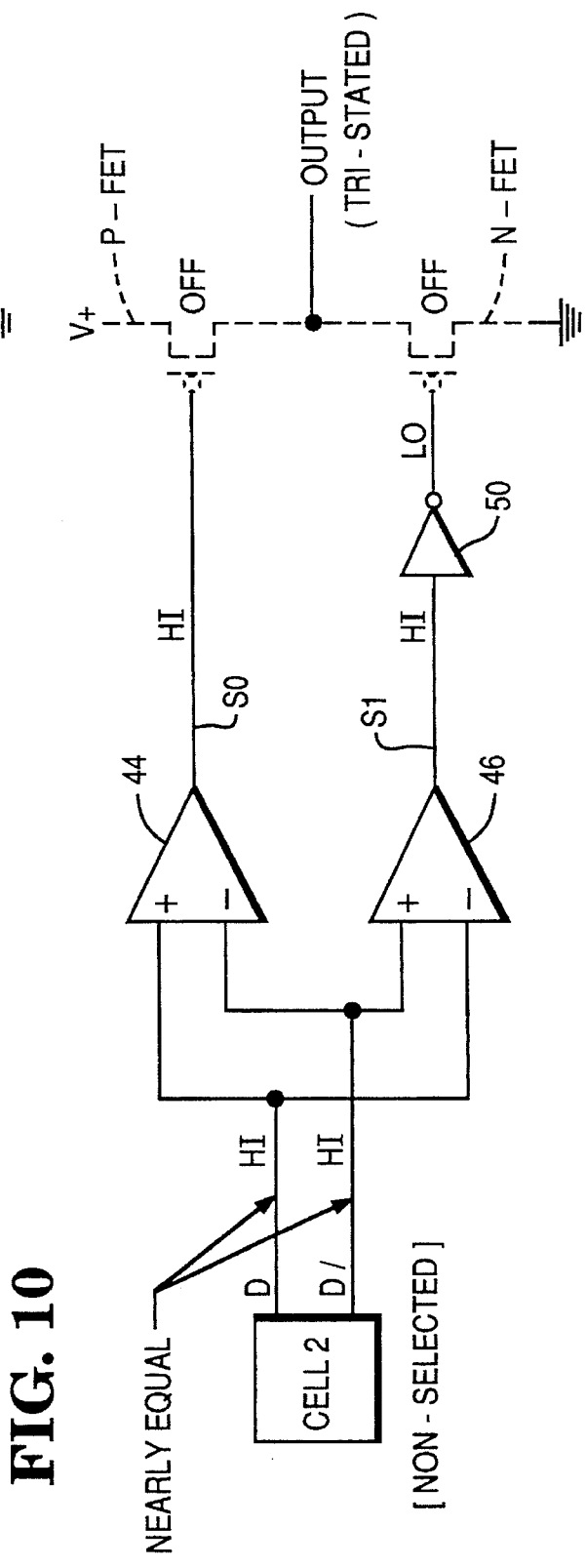

MEMORY WITH LATCHED OUTPUT

This is a continuation of application Ser. No. 07/958,978 filed Oct. 9, 1992, now abandoned.

The invention concerns latching the output of random-access memory.

BACKGROUND OF THE INVENTION

Individual Memory Cell

FIG. 1 illustrates a memory cell. To store a DATA signal in the cell, first pull both the SELECT- and the WRITE lines HIGH, to thereby cause AND gates 3 and 6 to allow the DATA signal to reach the latch 9.

If the DATA signal is a ONE, the resulting state of the latch is shown in FIG. 2: the S-input receives a ONE and the R-input receives a ZERO. With these inputs, the flip-flop is driven into the "set" state, in which output X produces a ONE and output $\overline{X}$ produces a ZERO. Output X is taken as the stored value, and output $\overline{X}$ is ignored (in the present context). Thus, the "set" state stores a ONE.

Conversely, if the DATA signal is a ZERO, the resulting state of the flip-flop is shown FIG. 3: the S-input receives a ZERO and the R-input receives a ONE. With these inputs, the latch is driven into the "reset" state, in which output X produces a ZERO and output $\overline{X}$ produces a ONE. The "reset" state stores a ZERO (at output X).

The SELECT in FIG. 1 also controls whether the stored data (at output X of the latch 9) reaches the OUTPUT. That is, if the SELECT line is ZERO, AND gate 12 prevents the data at output X from reaching the OUTPUT. Conversely, if the SELECT line is ONE, AND gate transmits the data from output X to the OUTPUT.

Collection of Individual Cells

The memory cell of FIG. 1 is indicated by the symbol 14 shown at the bottom of that Figure. A collection of these individual cells 14 can form a Random Access Memory (RAM), as indicated in FIG. 4. The RAM is the 16-to-1 type: it contains 16 cells, each of which stores one bit. The cells are arranged into four rows and four columns.

Row Decoder

To retrieve a bit from the RAM, a ROW DECODER 15 is given a two-bit address word on lines 18, and selects the row of cells indicated by the ADDRESS word. For example, when the ADDRESS word $A_1A_0$ equals 00, the decoder pulls SELECT LINE 00 HIGH. (The effect of the SELECT LINE upon the individual cells was explained in connection with FIG. 1.) When SELECT LINE 00 is HIGH, all of the cells in row 00 deliver their contents to the respective OUTPUT lines 24–27.

Similarly, when the ADDRESS word is 01, the DECODER actuates the SELECT line 01, causing all cells in row 01 to deliver their contents to the respective output lines 24–27. The SELECT lines 10 and 11 operate in the same way.

Selecting Column After Row is Selected

Once a row of cells has been actuated, one of the four output lines 24–27 must be selected. The selection is done by a COLUMN DECODER 21, which selects one of the output signals, and suppresses the rest, by means of the AND gates 30A–30D. For example, as shown in FIG. 5, if the address input to the COLUMN DECODER 21 is 11, then column 11 is selected, thus delivering the output of the shaded cell to the OUTPUT, as indicated by dashed path 36.

One Type of Decoder

FIG. 6 illustrates how one type of DECODER works. When the address input $A_1A_0$ is 00, all AND gates (with one exception) receive at least one ZERO, and consequently produce a ZERO as output. The exception is AND gate 39, which receives two ONEs, because of INVERTERS 41. Thus, only AND gate 39 produces a ONE as output.

When this output connects to SELECT line 00, all cells in row 00 become selected. Similarly, when the address input to the decoder is 01, AND gate 42 alone receives two ONEs, and it solely produces a ONE as output, on SELECT LINE 01. SELECT LINES 10 and 11 are actuated in similar ways.

Disadvantages

This particular type of cell selection has two disadvantages when high-speed operation is desired. First, the COLUMN DECODER 21 (contained in dashed block 42 in FIG. 4) delays the data travelling from a cell to the OUTPUT. That is, the data leaving a cell must pass through AND gates 30A–30D and OR gate 33. These gates delay the data.

A second disadvantage is that, when a new address is applied to the DECODERS in FIG. 4, there is no longer any certainty that the data present at the OUTPUT of the OR gate 33 represents the data contained in the previously selected cell, namely, the shaded cell in FIG. 5. That is, when DECODER 21 receives a new address, it activates one of its four output lines, almost immediately, thereby selecting one of the output lines 24–27. The OUTPUT data produced by OR gate 33 is no longer valid.

Therefore, two disadvantages are (1) a relatively long access time (because the data must travel through the COLUMN DECODER) and (2) a short output hold time (because the data becomes corrupted as soon as a new address is applied to the COLUMN DECODER.)

OBJECTS OF THE INVENTION

It is an object of the invention to provide improved access times in RAM.

It is a further object of the invention to provide improved output hold times in RAM.

SUMMARY OF THE INVENTION

In one form of the invention, a Random Access Memory (RAM) delivers data to an output. A latch holds the data at the output until the RAM delivers new data, which overrides the latch.

BRIEF DESCRIPTION OF TEE DRAWINGS

FIG. 1 illustrates a memory cell used in Random Access Memory (RAM).

FIGS. 2 and 3 illustrate the "set" and "reset" states of the latch in the RAM of FIG. 1.

FIGS. 8–10 illustrate different operating conditions of the CELL, SENSE AMPLIFIER, and TRI-STATE DRIVER of FIG. 7.

DETAILED DESCRIPTION OF THE INVENTION

Simplified Form of the Invention
Background: Differential Memory Cells

For simplicity, the Background of the Invention discussed "single-ended" memory cells. Each of these memory cells has a single output. The invention uses different memory cells, namely, cells having differential outputs. Such a cell is shown in FIG. 6A.

Data is delivered on lines B and $\overline{B}$. Two inverters I act as a latch, and store the data. For example, assume that the inverters are in the LO and HI configurations shown in FIG. 6B. When line WL is brought HI, as indicated, the FETs act as closed switches. (To show the closure, the FETs are drawn in phantom, and solid bars are drawn between the source and drain.)

Now, the LO signal pulls line $\overline{B}$ to a LOW value, while line B remains HI. (Line $\overline{B}$ does not reach the actual voltage of the LO signal produced by the inverters, because resistor R2 and the channel of FET2 act as a voltage divider. In practice, line $\overline{B}$ may be pulled to a value such as 4 volts, while line B may be pulled to 5 volts. One line is relatively LO with respect to the other.) The difference in voltages (i.e., 4 versus 5 volts) provides the difference signals D and $\overline{D}$ discussed later, beginning with FIG. 7.

Figure 4:
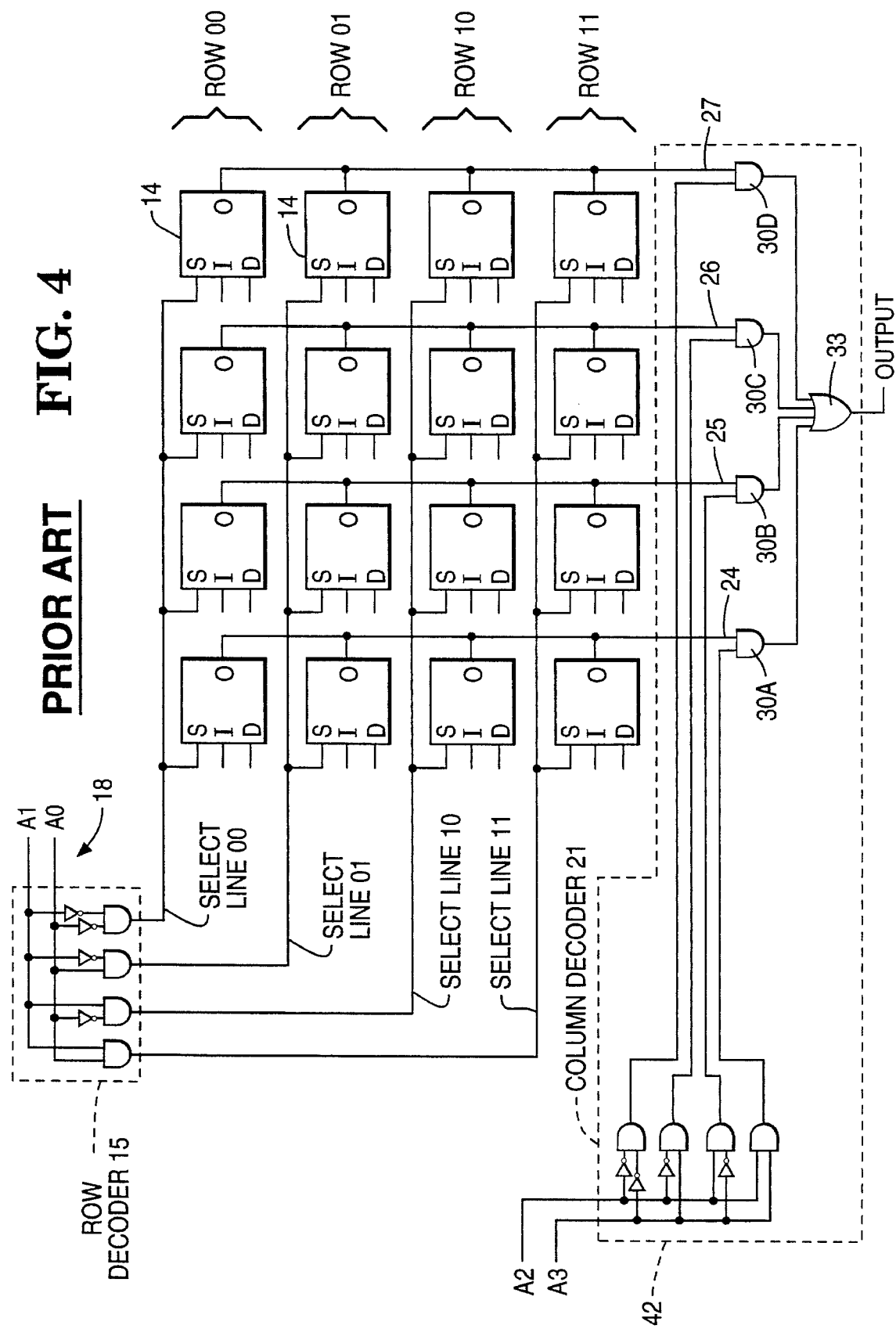
FIG. 4 illustrates a RAM.
Figure 5:
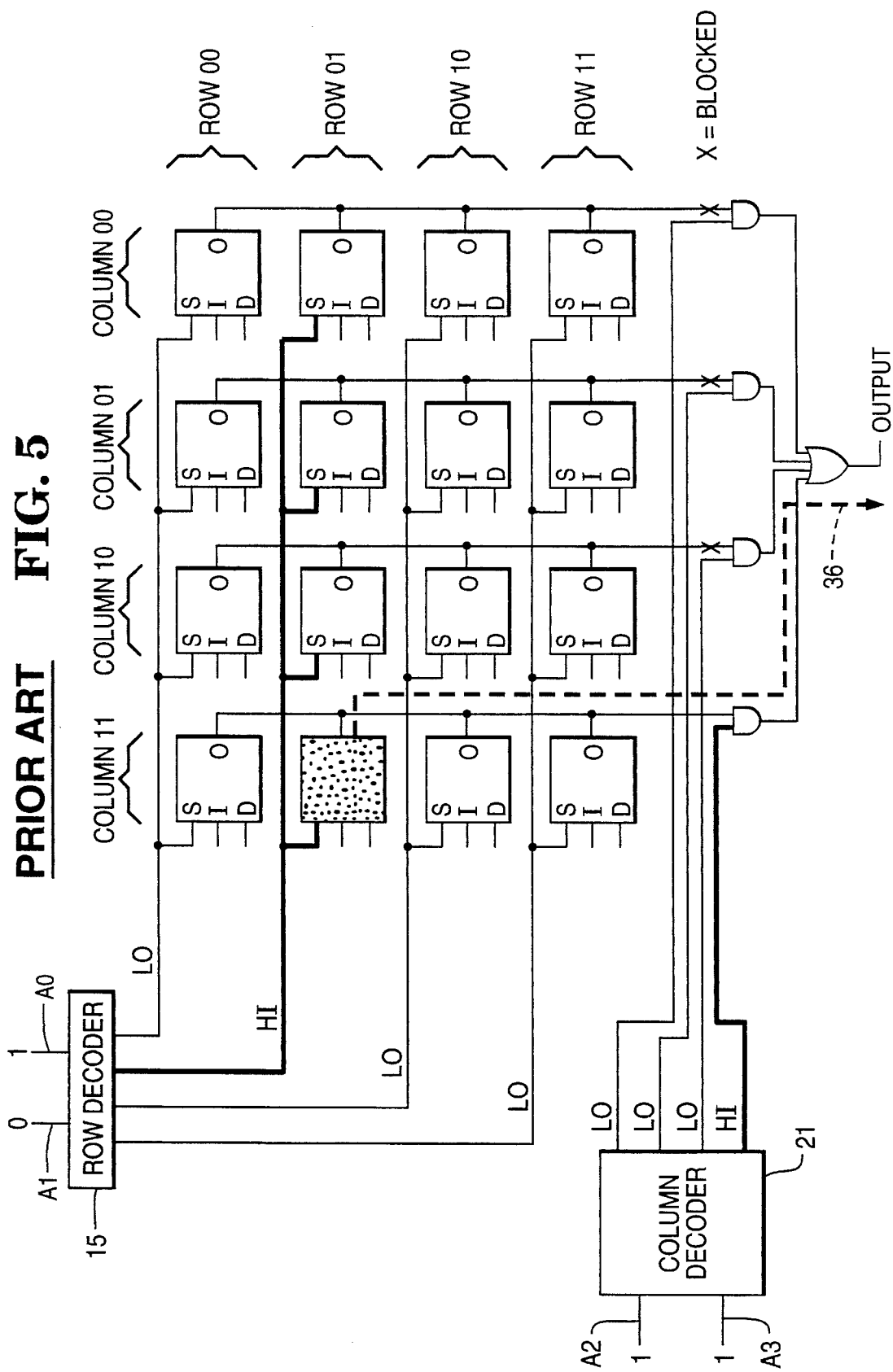
FIG. 5 illustrates the selection of a single cell in the RAM of FIG. 4.
Figure 6:
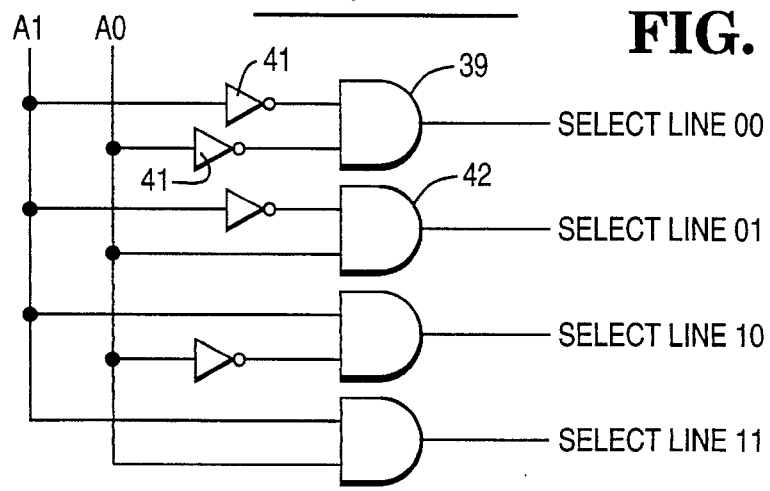
FIG. 6 illustrates a decoder.
Figure 6A:
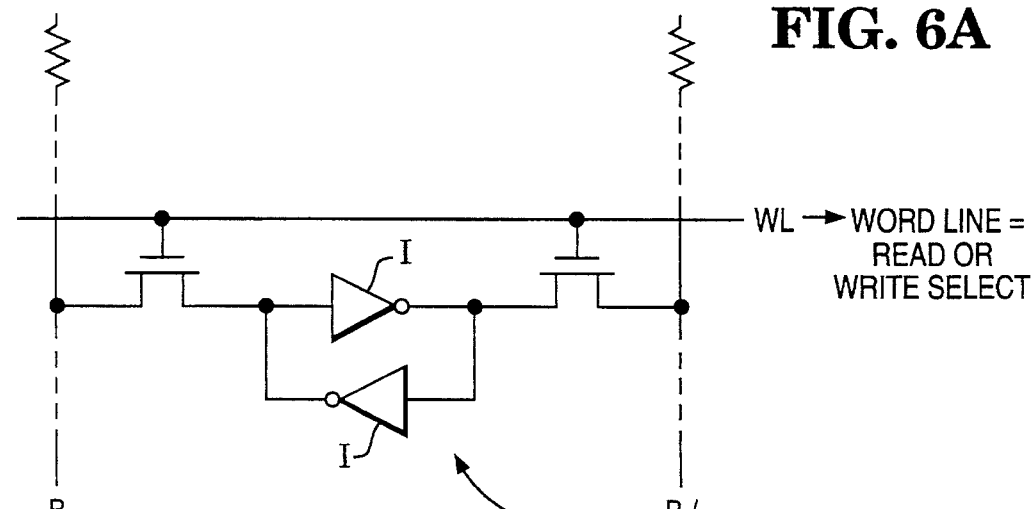
FIG. 6A illustrates a memory cell which produces a differential output.
Figure 6B:
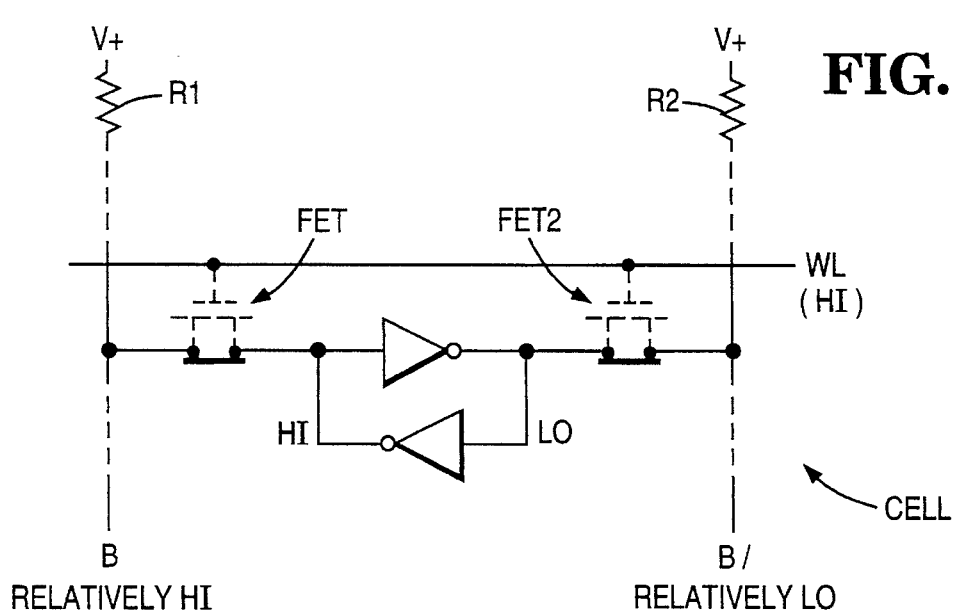
FIG. 6B illustrates the cell of FIG. 6A, during a read operation.
Figure 6C:
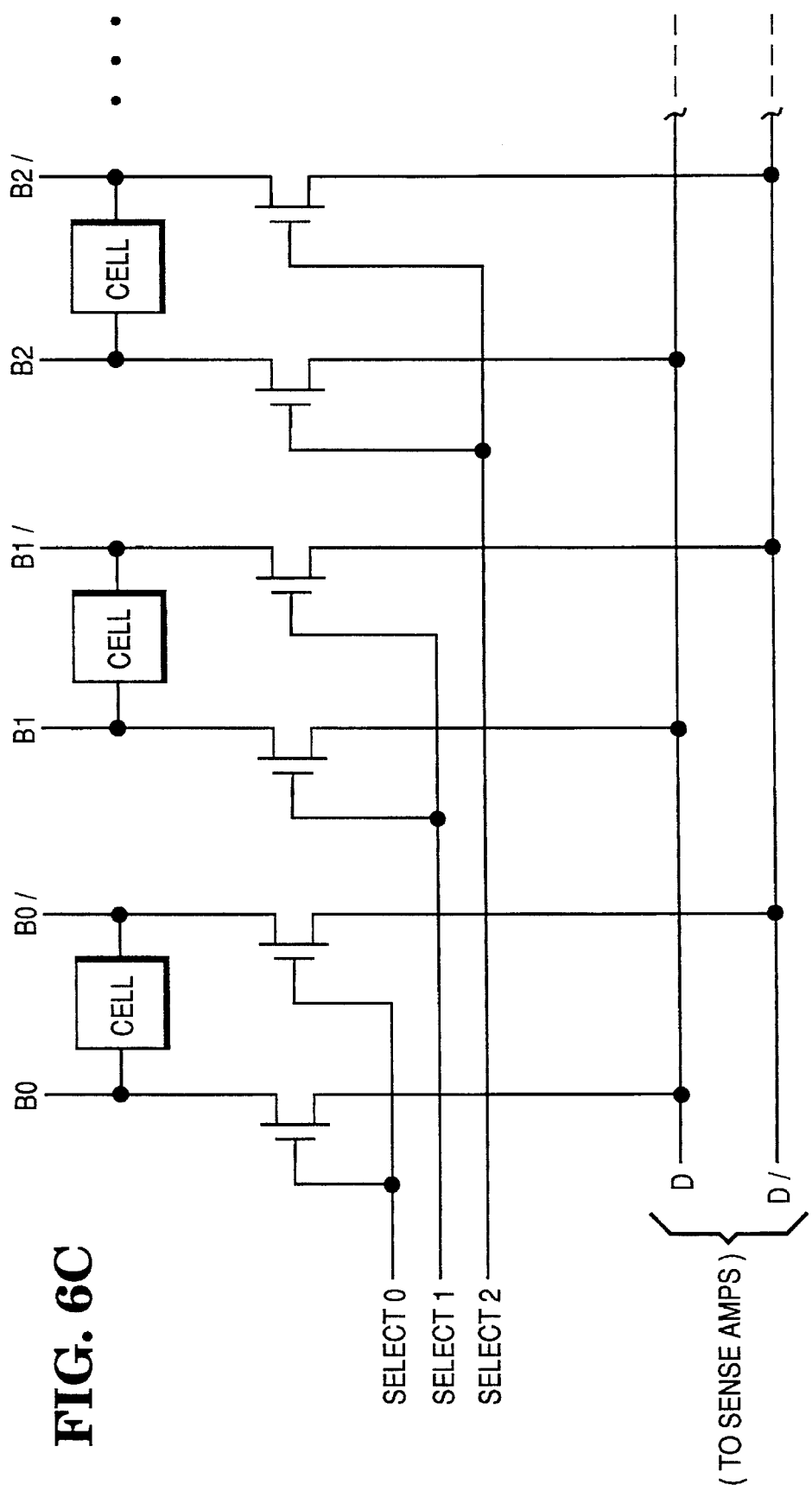
FIG. 6C illustrates a RAM comprising three of the cells of FIG. 6A.

Multiple differential cells of the type shown in FIG. 6A are shown in FIG. 6C. To read a cell, actuate a select line, such as SELECT 1, which connects the data in cell 1 to lines D and $\overline{D}$. The data is a differential signal.

Invention

Figure 7:
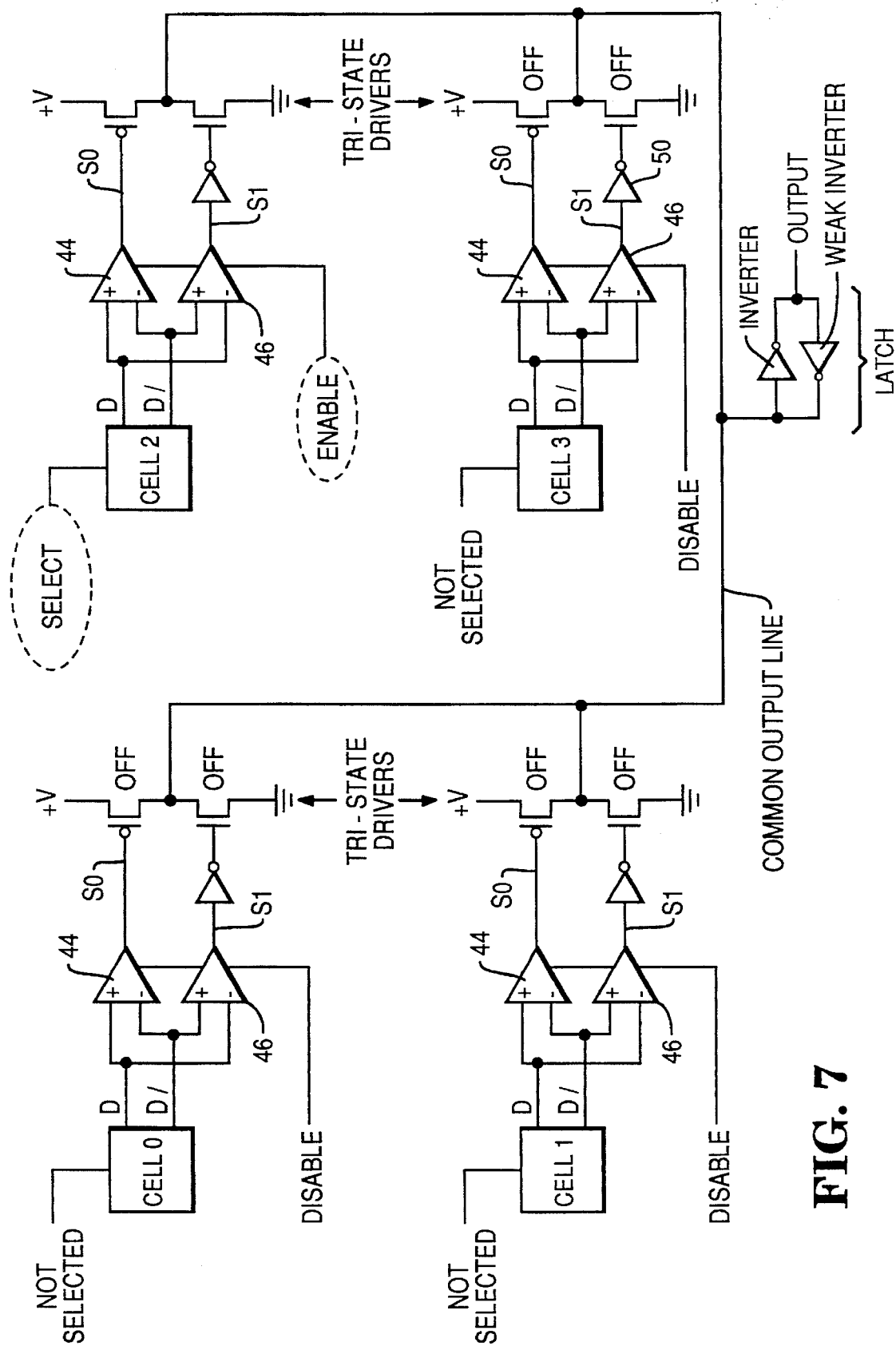
FIG. 7 illustrates a simplified form of the invention.

FIG. 7 shows four memory cells, namely, CELL_0 through CELL_3. The cells produce output signals according to the rules given in Table 1:

TABLE 1

| SELECTION STATUS OF CELL | DATA CONTENTS | OUTPUTS D | $\overline{D}$ |
|---|---|---|---|
| SELECTED | ONE | HI | LO |
|  | ZERO | LO | HI |
| NOT SELECTED | ONE | HI | HI |
|  | ZERO | HI | HI |

That is, when a cell is selected, D is HIGH if a ONE is stored, and D is LOW if a ZERO is stored. $\overline{D}$ is the inverse of D. When the cell is not selected, both D and $\overline{D}$ are HIGH, irrespective of the data stored.

(The reader is reminded that the signals D and $\overline{D}$ will probably not reach the full voltages defined for HIGH and LOW logic signals. D and $\overline{D}$ are differential signals. The reason was discussed above, in connection with FIG. 6B.)

The sense amplifiers 44 and 46 produce outputs according to Table 2.

TABLE 2

| SELECTION STATUS OF AMPLIFIER PAIR | D | $\overline{D}$ | S0 | S1 |
|---|---|---|---|---|
| SELECTED | HI | LO | HI | LO |
| SELECTED | LO | HI | LO | HI |
| SELECTED | HI | HI | HI | HI |
| SELECTED | LO | LO | NOT ALLOWED | |

TABLE 2-continued

| SELECTION STATUS OF AMPLIFIER PAIR | D | $\overline{D}$ | S0 | S1 |
|---|---|---|---|---|
| NOT SELECTED | ANY | ANY | HI | HI |

That is, when the amplifier pair is selected, signal S0 is the same as D and S1 is the opposite. However, if D and $\overline{D}$ are both HIGH, which occurs when the memory cell is not selected (see Table 1), then S0 and S1 are both HIGH. Similarly, if the amplifier pair is not selected, S0 and S1 are both HIGH.

The sense amplifiers 44 and 46 are differential amplifiers. Differential amplifiers, in general, do not necessarily produce a HIGH output when the inputs are both HIGH. However, it is known in the art how to construct differential amplifiers which do so, and sense amplifiers 44 and 46 are such, as indicated by the characteristics given in Table 2.

Selection of a Cell

Figure 8:
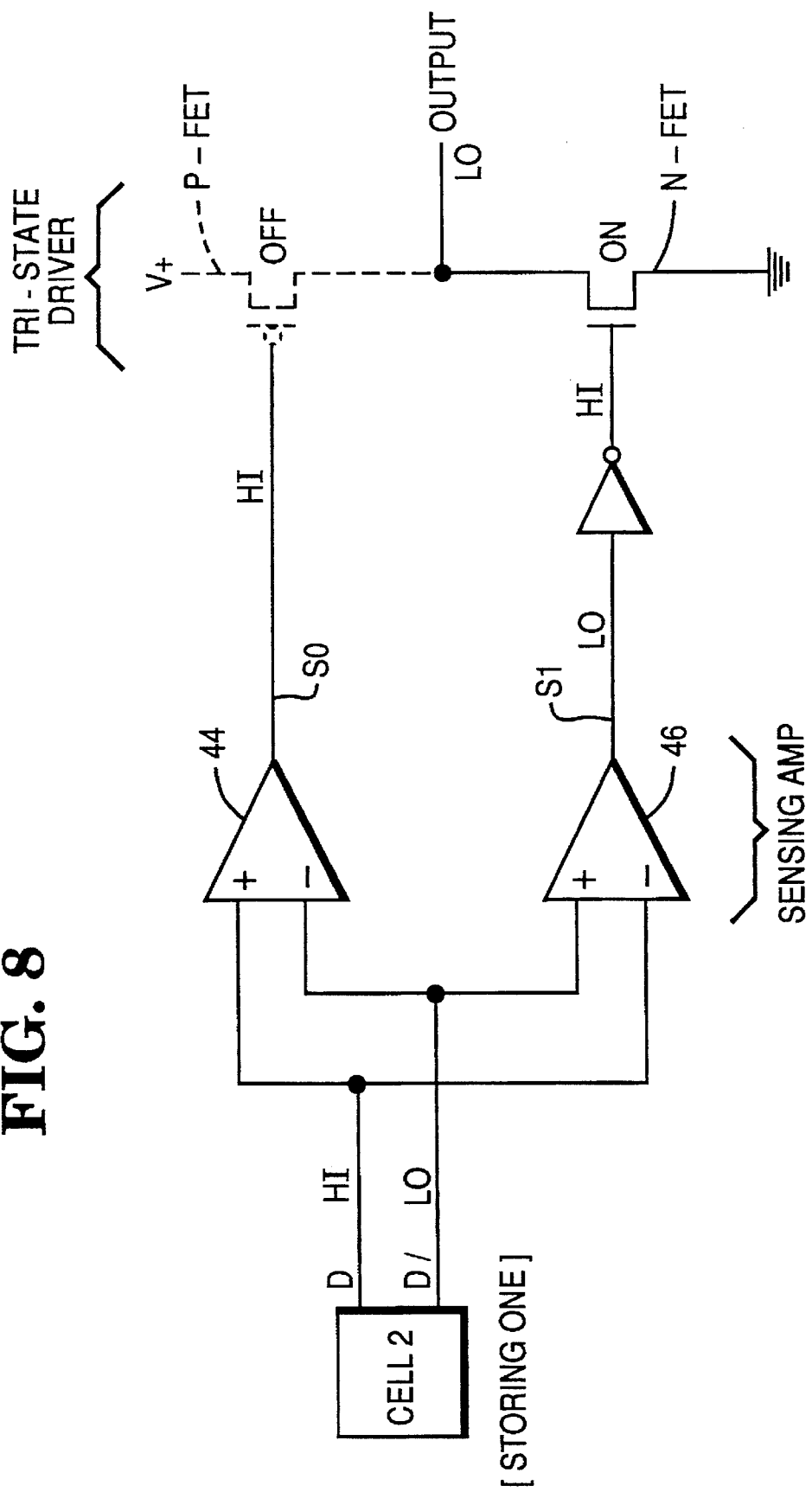

Assume that CELL_2 in FIG. 7 has been selected by a decoder (not shown), as indicated by the symbol SELECT, and that CELL_2 stores a ONE. (The reader should ignore the DISABLE and ENABLE signals applied to amplifiers 44 and 46 at this time.) The other cells are not selected. CELL_2 produces the data signal pair D $\overline{D}$, which equal 10 (because a ONE is stored), and the situation is shown in FIG. 8.

In that Figure, sense amplifier 44 produces a HIGH signal, while sense amplifier 46 produces a LOW signal. The TRI-STATE DRIVER is placed into the condition shown: P-FET (P-channel Field-Effect Transistor) is OFF, and N-FET (N-channel Field-Effect Transistor) is ON. The OUTPUT is LOW. Thus, the stored ONE in CELL_2 in FIG. 7 produces a ZERO at the COMMON OUTPUT LINE. (The influence, if any, of the other cells on the COMMON OUTPUT LINE will be explained later.) The stored data has been delivered, but inverted.

Now assume that CELL_2 stores a ZERO, instead of a ONE. The data signals D $\overline{D}$ equal 01, and the situation is shown in FIG. 9. Sense amplifier 44 produces a LOW signal, while sense amplifier 46 produces a HIGH signal. P-FET is ON, and N-FET is OFF. The OUTPUT is HIGH. Thus, the stored ZERO produces a HIGH output. Again, the stored data has been inverted.

CELL_2 is the only cell selected in FIG. 7. Because the other cells are not selected, they produce data outputs, D $\overline{D}$, of 11, as Table 1 indicates. They are all in the same condition, which is shown in FIG. 10. The "11" signal on D and $\overline{D}$ cause both sense amplifiers 44 and 46 to produce HIGH signals. The "11" signal can be viewed as a DATA ABSENT signal. Inverter 50 inverts one of the HIGH signals. Both P-FET and N-FET are turned OFF, as indicated.

Therefore, to recapitulate, in FIG. 7, the situation is this: The FETs in all TRI-STATE DRIVERS (except the DRIVER driven by CELL_2) are OFF, as indicated. These "OFF" drivers are in the TRI-STATE condition. The "OFF" FETs within these DRIVERs act as very large resistors, and apply no signal to the COMMON OUTPUT LINE. The remaining TRI-STATE DRIVER, namely, that driven by CELL_2, applies a signal to the COMMON OUTPUT LINE. That signal is the inverse of the data stored in CELL__2.

Output Latch

A LATCH is connected to the COMMON OUTPUT LINE. The LATCH is constructed of two cross-coupled INVERTERs. One INVERTER is labeled "weak." "Weak" means that the INVERTER can be overriden by a sufficiently large signal applied to the COMMON OUTPUT LINE. One way to construct a "weak" INVERTER is to give it a smaller gain than the "strong" INVERTER. "Weak" INVERTERs are known in the art.

One definition of "cross-coupled" is that the output of the "strong" INVERTER is connected to the input of the "weak" INVERTER. The output of the "weak" INVERTER connects to the input of the "strong" INVERTER.

Latch's Operation

For example, continue the example given above, and assume that CELL__2's TRI-STATE DRIVER is presently applying a ONE to the COMMON OUTPUT LINE. All other TRI-STATE DRIVERS are in the TRI-STATE condition, and they apply no signal to the COMMON OUTPUT LINE.

Assume that the DECODERs now actuate a different cell. Now CELL__2 becomes de-selected, and it produces data outputs of D $\overline{D}$=11 (see Table 1). These outputs cause its sense amplifiers to produce signals S0=1 and S1=1. (See Table 2 and FIG. 10.) S1 is inverted by inverter 50. Now, both FETs in the TRI-STATE DRIVER are turned OFF, as indicated in FIGS. 7 and 10. However, this turn-off does not affect the LATCH; it still holds the data present on the COMMON OUTPUT LINE.

The new cell, together with its sense amplifier and the associated TRI-STATE DRIVER, will apply a new data bit to the COMMON OUTPUT LINE. If this new data bit is a ONE, nothing changes: the LATCH retains the ONE which it is presently holding. On the other hand, if the new data bit is a ZERO, the LATCH toggles, and is forced to store a ZERO.

The toggling is allowed by virtue of the "weak" INVERTER, which can be overriden by the new signal presented to the COMMON OUTPUT LINE. As a specific example of overriding, the LATCH retains the stored ONE until the COMMON OUTPUT LINE is pulled to a predetermined low voltage, such as 0.5 volts. Conversely, if the latch is holding a ZERO, it retains the stored ZERO until the COMMON OUTPUT LINE is pulled up to a predetermined high voltage, such as 4.5 volts, or such as 80% of the maximum high signal voltage expected on the COMMON OUTPUT LINE.

Conclusion re: Simplified Form of Invention

In this form of the invention, a single cell (CELL__2) was selected, together with a single sense amplifier (i.e., that associated with CELL__2). Another form of the invention will be illustrated, wherein multiple cells are selected, together with multiple sense amplifiers. However, data is only delivered by the selected sense amplifier which is coupled to a selected cell.

More Complex Form of the Invention

Figure 11:
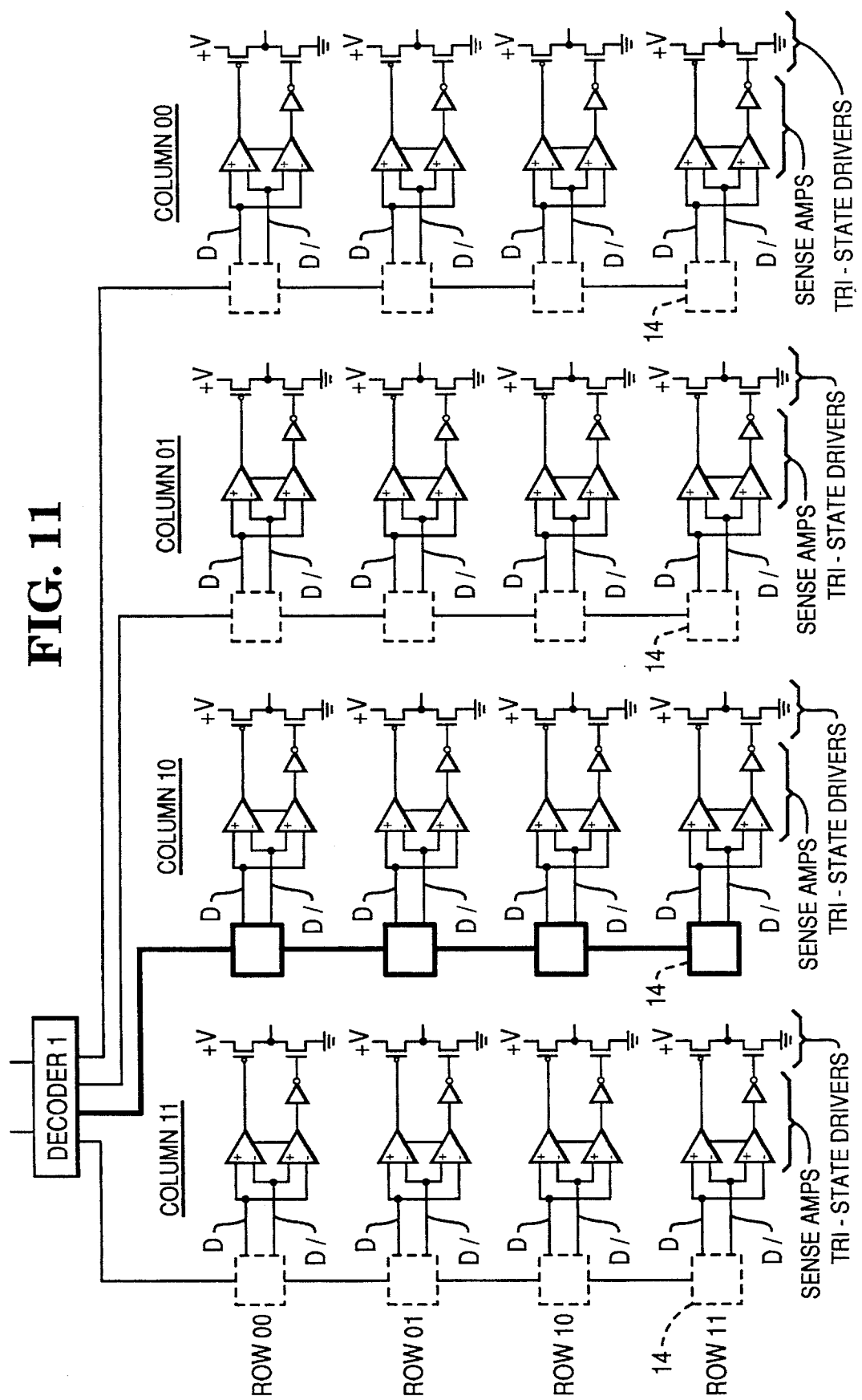
FIG. 11 illustrates another form of the invention.

FIG. 11 shows 16 memory cells 14. Assume that DECODER__1 selects column 10, as indicated by the heavy lines. All of these cells in this column are now delivering their data to their respective D and $\overline{D}$ lines.

Figure 12:
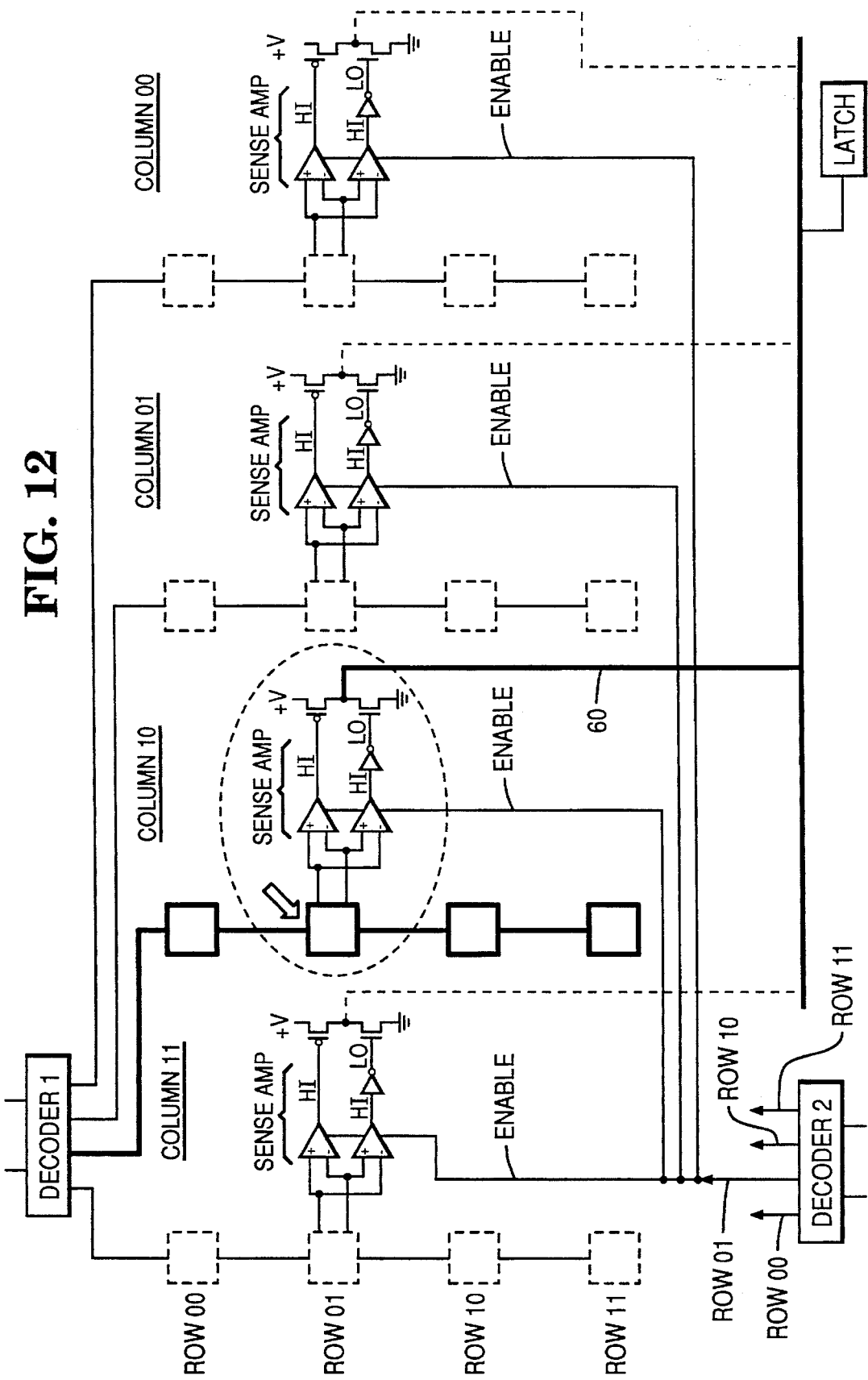
FIG. 12 illustrates how a single cell in FIG. 11 is selected.

In FIG. 12, assume that DECODER 2 selects all of the sense amplifiers (labeled SENSE AMP) in row 01. (Some components have been eliminated from FIG. 12 for clarity.) However, even though all of the SENSE AMPs in row 01 are selected, only a single one of these will be connected to a cell which has been selected. That selected cell is contained within the dashed circle, and is located in row 01, column 10.

The non-selected cells will produce D $\overline{D}$ outputs of "11" (see Table 1). Their associated sense amplifiers will cause the associated TRI-STATE DRIVERs to enter the TRI-STATE condition (see Table 2). The remaining sense amplifiers (not all shown in FIG. 12) will also cause their associated TRI-STATE DRIVERs to enter the TRI-STATE condition (see Table 2).

To repeat, all SENSE AMPLIFIERS (except the SENSE AMPLIFIER connected to the selected cell) are driven into the TRI-STATE condition, but for two different reasons. That is, there are two classes of SENSE AMPs, namely, those which are selected (i.e., those in row 01 in FIGS. 11 and 12) and those which are not (i.e., those in rows 00, 10, and 11 in FIG. 11).

All which are not selected cause their associated TRI-STATE DRIVERs to enter the TRI-STATE condition (See Table 2), by virtue of being non-selected. All which are selected, with one exception, cause their associated TRI-STATE DRIVERS to enter the TRI-STATE condition, by virtue of receiving "11" signals from their unselected cells (See Tables 1 and 2).

The exception is contained in the dashed circle in FIG. 12. The exception is a selected cell coupled to a selected SENSE AMPLIFIER. This SENSE AMPLIFIER does not drive its TRI-STATE DRIVER into the TRI-STATE condition. Instead, its TRI-STATE DRIVER applies an inverted data signal to the COMMON OUTPUT LINE, as indicated by the heavy line 60.

A LATCH, comprising weak/strong inverters, holds the data until overriden, as discussed above.

More General Form of the Invention

Figure 13:
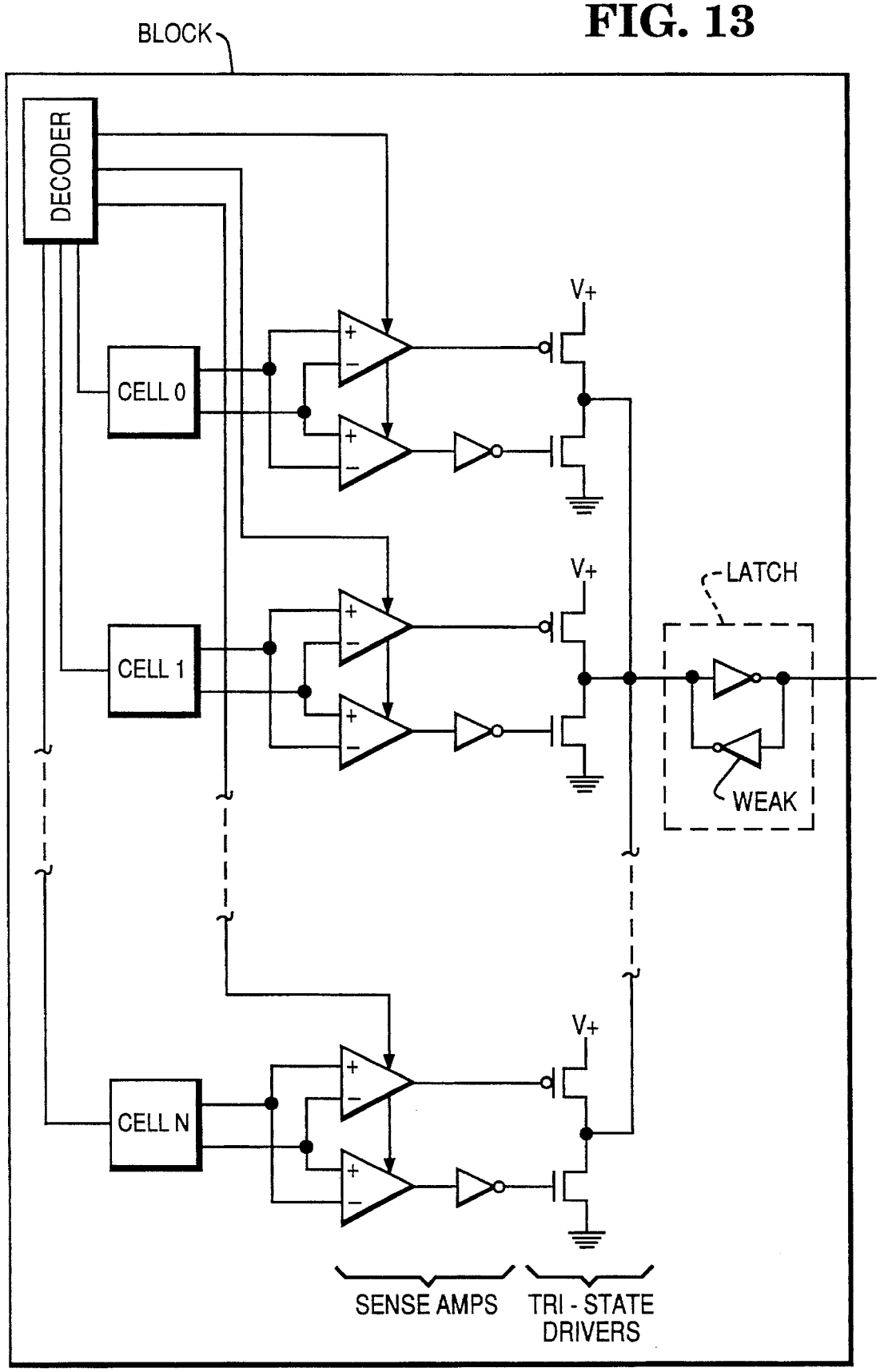
FIG. 13 illustrates a block of memory which contains one form of the invention.

FIG. 13 shows a BLOCK of memory. It contains multiple cells, each with a SENSE AMPLIFIER and a TRI-STATE DRIVER. A DECODER selects a single cell-sense amplifier pair.

The DECODER can select a single CELL, together with its associated SENSE AMPLIFIER, as discussed in the section entitled "Simplified Form of the Invention." Alternately, the DECODER can select multiple CELLs, together with multiple SENSE AMPLIFIERS, as discussed in the section entitled "More Complex Form of the Invention."

As another alternate, the DECODER can select an intermediate combination of CELLs and SENSE AMPLIFIERs. For example, the DECODER can select multiple CELLs, but a single SENSE AMPLIFIER. As another example, the DECODER can select a single CELL, but multiple SENSE AMPLIFIERs. As yet another alternate, each CELL need not be equipped with a SENSE AMPLIFIER; two (or more) CELLs can share a SENSE AMPLIFIER, by multiplexing. Different design goals will dictate which approach is taken.

Figure 14:
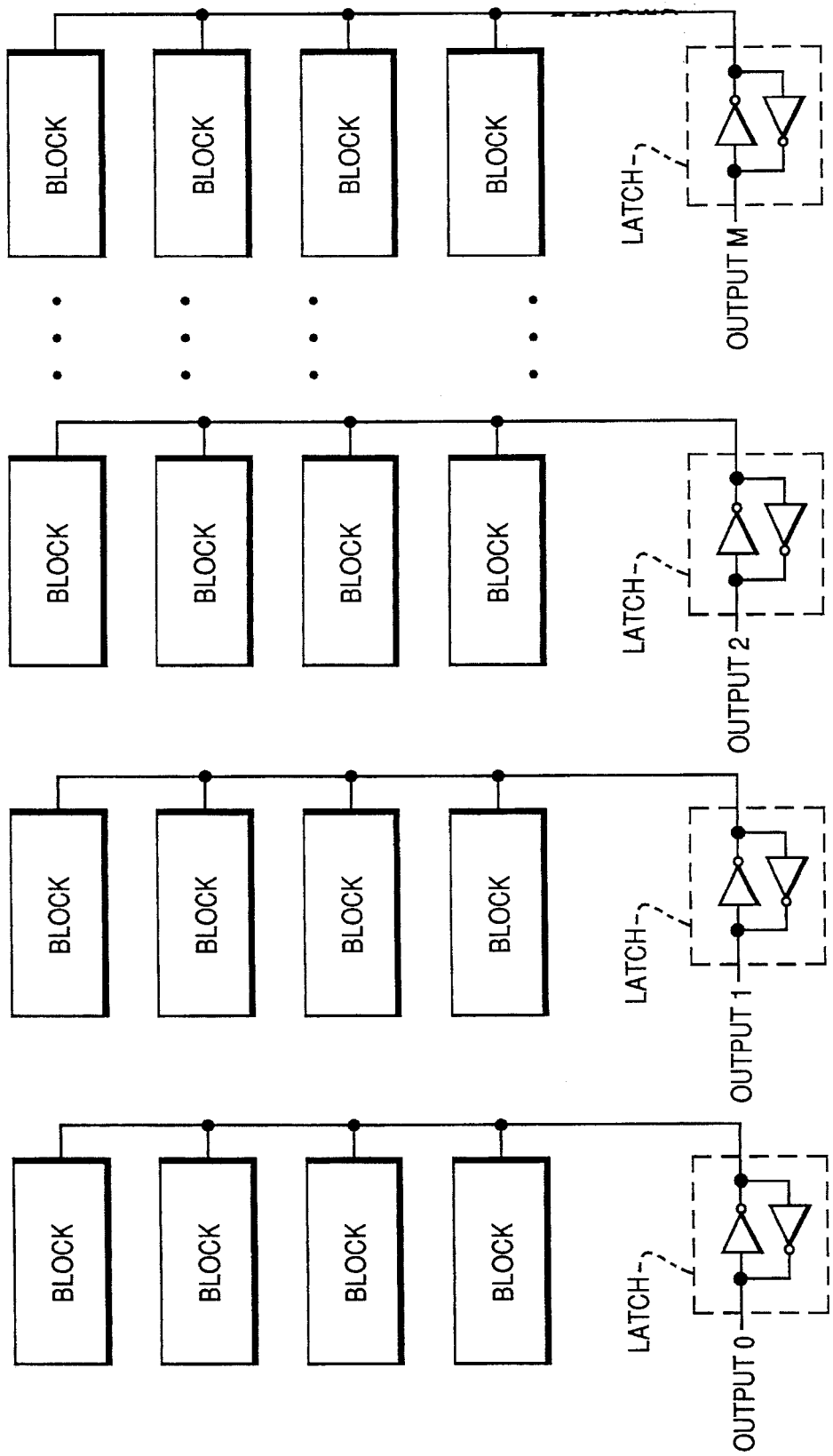
FIG. 14 illustrates multiple blocks, each of the type shown in FIG. 13.

FIG. 14 shows several BLOCKs, each of the type shown in FIG. 13. The apparatus described above causes a single cell within each column of BLOCKs to apply its data to its respective output LATCH, which produces OUTPUT 0, OUTPUT 1, etc. All other cells hold their respective TRI-STATE DRIVERS, shown in FIG. 13, in the TRI-STATE condition.

Additional Considerations

1. The SENSE AMPLIFIERS 44 and 46 in FIG. 8 act, in a sense, as level-shifters. That is, as stated above, the difference between D and $\overline{D}$ may be only about one volt (i.e., D may be 5 volts, and $\overline{D}$ may be 4 volts). Under these circumstances, SENSE AMPLIFIER 44 acts as a differential amplifier, and produces a full logic HI signal, as indicated, while SENSE AMPLIFIER 46 also acts as a differential amplifier and produces a full logic LO signal.

One reason for the level-shifting is to produce a signal which is strong enough to overcome the weak inverter in the LATCH shown in FIG. 13.

Also, as stated above, these SENSE AMPLIFIERS produce outputs of HI when both inputs are HI.

2. The Inventor emphasizes that it is not necessary that the TRI-STATE DRIVERs deliver a cell's data in inverted form. In the invention, the LATCH re-inverts the data, to provide the correct data. In other forms of the invention, non-inverting TRI-STATE DRIVERs could be used, with non-inverting LATCHes.

3. Also, the claims speak of delivering data stored in a CELL. This language is considered to cover delivering inverted data from a CELL, because if the inversion is done consistently, then, in effect, the data is delivered.

4. It is noted that the D and $\bar{D}$ outputs, such as shown in FIG. 6C and 8, are not constrained to always act as a 4:5 volt differential pair. For example, when data is written to the cell in FIG. 6C, D will be driven to a full logic HI (or LO) and $\bar{D}$ will be driven to the opposite, namely, a full logic LO (or HI).

Numerous substitutions and modifications can be undertaken without departing from the true spirit and scope of the invention. What is desired to be secured by Letters Patent is the Invention as defined in the following claims.

I claim:

1. A Random Access Memory, comprising:
   a) a plurality of data cells, each of which produces DATA, when selected, or a DATA ABSENT signal, when not selected; and
   b) sense means for isolating an output line, in response to the DATA ABSENT signal.

2. Memory in a computer, comprising:
   a) a plurality of memory cells,
      i) each having an ENABLE input which allows contents of a cell to reach a cell output, and
      ii) each having a differential output D and $\bar{D}$, and producing
         A) a first differential signal pair on D and $\bar{D}$ when a ONE is stored in the cell and the cell is ENABLED;
         B) a second differential signal pair on D and $\bar{D}$ when a ZERO is stored in the cell and the cell is ENABLED;
         C) a third differential signal pair on D and $\bar{D}$ when the cell is not ENABLED;
   b) a sense amplifier for each memory cell, comprising a first and second differential amplifier each having (+) and (−) inputs, connected such that the D output connects to the (+) input of the first differential amplifier and the (−) input of the second differential amplifier; and the $\bar{D}$ output connects to the (−) input of the first differential amplifier and the (+) input of the second differential amplifier;
   c) a p-channel FET in series with an n-channel FET for each sense amplifier, with the drain of the n-channel FET connected to the drain of the p-channel FET, and connected such that the gate of the p-channel FET connects to the output of the respective first differential amplifier, and the gate of the n-channel FET connects to the output of an inverter whose input connects to the output of the second respective differential amplifier; and
   d) a common output line connected to the drains of all n-channel FETs in element c).

3. A Random Access Memory (RAM), comprising:
   a) a plurality of memory cells, each of which produces:
      i) first data signals when the cell stores a ONE and the cell is selected; and
      ii) second data signals when the cell stores a ZERO and the cell is selected; and
      iii) third data signals when the cell is not selected;
   b) a sense amplifier for each memory cell which produces:
      i) a first pair of signals in response to the first data signals, when the sense amplifier is selected;
      ii) a second pair of signals in response to .the second data signals, when the sense amplifier is selected; and
      iii) a third pair of signals in response to the third data signals, whether or not the sense amplifier is selected; and
   c) a driver for each sense amplifier, which applies
      i) a first output signal to an output line, in response to said first pair of signals from the respective sense amplifier;
      ii) a second output signal to said output line, in response to said second pair of signals from the respective sense amplifier; and
      iii) no signal to said output line, in response to said third pair of signals from the respective sense amplifier.

* * * * *